United States Patent [19]

Therssen

[11] Patent Number: 5,225,787
[45] Date of Patent: Jul. 6, 1993

[54] SAMPLING FREQUENCY CONVERTER INCLUDING A SIGMA-DELTA MODULATOR

[75] Inventor: Dieter E. M. Therssen, Leuven, Belgium

[73] Assignee: U.S. Philips Corporation, New York, N.Y.

[21] Appl. No.: 867,584

[22] Filed: Apr. 13, 1992

[30] Foreign Application Priority Data

May 10, 1991 [EP] European Pat. Off. ........ 91201136.8

[51] Int. Cl.$^5$ ............................................. H03B 1/04
[52] U.S. Cl. ..................................... 328/15; 328/151; 328/167; 307/521
[58] Field of Search .................. 307/521; 328/15, 151, 328/167

[56] References Cited

U.S. PATENT DOCUMENTS

| 4,965,531 | 10/1990 | Riley | 331/1 A |
| 5,119,093 | 6/1992 | Vogt et al. | 328/15 |
| 5,128,623 | 7/1992 | Gilmore | 328/15 |

Primary Examiner—John S. Heyman
Assistant Examiner—Margaret Rose Wambach
Attorney, Agent, or Firm—Edward W. Goodman

[57] ABSTRACT

Sampling frequency converter for converting the sampling frequency of a discrete-time signal ($d_i$) from a first sampling frequency ($f_i$) to a second sampling frequency ($f_o$) by sample validation, the number of samples of the discrete-time signal being omitted (or repeated) per unit of time depending on the frequency difference between the first and second sampling frequencies, so that a validated sample sequence is developed with a third sampling frequency having a value $f_v$ which, in essence, is equal to the value $f_o$ (or $f_i$), the converter including a frequency meter (52) for converting a frequency difference between the second (or first) and third sampling frequencies to a control signal ($v_c$) which is a measurement for the frequency difference, a sigma-delta modulator (10) for converting the control signal to an at least binary decision signal (24), and a validation circuit (48) for omitting (or repeating) a sample from the discrete-time signal $d_i$ in response to the decision signal.

8 Claims, 7 Drawing Sheets

SAMPLING FREQUENCY CONVERTER INCLUDING A SIGMA-DELTA MODULATOR

BACKGROUND OF THE INVENTION

1. Field of the Invention

The invention relates to a sampling frequency converter for converting the sampling frequency of a discrete-time signal from a first frequency to a second frequency, comprising:

a first clock pulse generator for generating first clock pulses which occur with the first frequency, a second clock pulse generator for generating second clock pulses which occur with the second frequency, selecting means for supplying selected samples of the discrete-time signal at the rhythm of third clock pulses which occur with a third frequency, and a selection signal generator for generating the third clock pulses.

2. Description of the Related Art

A converter of this type is known from "A Universal Digital Sampling Frequency Converter For Digital Audio", Proceedings IEEE International Conference on Acoustics, Speech and Signal Processing 1981 (ICASSP 81), Vol. 2, pp. 595-598. FIG. 1B. Sampling frequency converters are used when the sampling frequency of a digitized signal is to be changed. This occurs especially with digital audio signals. In the Compact Disc system, the sampling frequency is 44.1 Khz, in satellite broadcasting, 32 Khz, and in professional recording, 48 Khz. If digital signal sources having different sampling frequencies are to be coupled, the sampling frequency of one of the sources will have to be changed.

A method of sampling frequency conversion discussed, for example, in European Patent Application EP 0 052 847, consists of converting the digital signal to an analog signal and subsequently converting this analog signal to a digital signal having the desired sampling frequency. In order to avoid aliasing and all sorts of disturbing signals, the analog signal is to be carefully filtered. The filter, the digital-to-analog converter and the analog-to-digital converter make this method of sampling frequency conversion intricate and expensive.

Entirely digital solutions without the analog intermediate stage have been looked for. They are based on calculating, with the aid of digital interpolation and decimation filters, the value of new samples on the basis of available samples of the digital signal to be converted. As long as the given and desired sampling frequencies have a rational proportion, the conversion with the aid of such filters is effected in a relatively simple manner. The time patterns of the given and desired samples match in that case. Examples of such converters may be found in U.S. patent specifications U.S. Pat. Nos. 3,997,773, 3,988,607, 4,020,332 and 4,472,785. An instructive survey of the operation of interpolation and decimation filters may be found in the journal article entitled: "Interpolation and Decimation of Decimal Filters—A Tutorial Review", Proceedings of the IEEE, Vol. 69, No. 3, March 1981, pp. 300-331, which likewise provides extensive references to further literature.

It becomes more difficult if the time patterns do not match. In that case the distance between a desired and a given sample is always different. From European Patent Specifications EP 0 052 847, EP 0 099 600, EP 0 137 323, EP 0 151 829 and EP 0 227 172, sampling frequency converters are known in which the coefficients of an interpolation or decimation filter are constantly adjusted on the basis of this distance. With this type of converters extremely good results may be obtained, but they do require rather much hardware for calculating the coefficients.

A very simple manner of sampling frequency conversion is based on the omission or repetition of a specific number of samples from the incoming sample stream per time unit, depending on the frequency difference between the given and desired sampling frequencies. The process of sample omission, sample passing or sample repetition is termed validation. The validated sample sequence is rearranged with the desired sampling frequency so that an equidistant sequence of samples is obtained. This process leads to signal distortion. Omission/addition of samples from/to the original sample sequence and rearranging them according to a new time pattern results in expansion/compression of the digital signal. When the samples are rearranged according to the new time pattern, however, the extension/compression is eliminated again. However, an omission/addition results in a signal jump that had originally been absent in the analog signal. For a given sampling frequency difference, the expansion/compression has a fixed value causing a relatively ever enhancing phase shift for an increasing number of frequency components in the analog signal. In order to keep the analog signal distortion below a specific level, the sampling frequency is to be increased to a very high level, after which validation may take place, as is discussed in the article published in ICASSP 81. There it is stated that for an audio signal having a frequency of 20 Khz, which is to be sampled with a frequency of about 50 Khz, an oversampling factor $2^{15} = 32768$ is necessary for obtaining a signal-to-noise ratio of 90 dB after rearrangement. This necessitates an oversampling frequency of about 1.5 GHz. Such a high frequency renders the implementation of a sampling frequency converter difficult, intricate, expensive and hardly attainable with standard integrated circuit manufacturing processes.

SUMMARY OF THE INVENTION

It is an object of the invention to provide a sampling frequency converter which operates according to the essentially simple principle of validation, but which can operate at a lower oversampling frequency when a specific signal-to-noise ratio in the analog signal is to be obtained.

A sampling frequency converter of the type mentioned in the opening paragraph is characterized according to the invention, in that the selection signal generator comprises:

a frequency meter for generating a control signal in response to a frequency difference between the second frequency and a frequency which is proportional to the third frequency, a sigma-delta modulator for converting the control signal into an at least binary decision signal, and a validation gate for generating the third clock pulses in response to the first clock pulses by suppressing and passing the first clock pulses during a first and second decision signal value respectively.

Sigma-delta modulators, also termed noise shapers, are known per se in all kinds of variants and structures and may be implemented in analog or digital form. In such a modulator, a binary output signal, changing with a high frequency between, for example, +1 and −1, is generated by applying oversampling and error signal feedback. The spectrum for low frequencies for this binary signal is substantially equal to the spectrum for the signal applied to the input of the sigma-delta modulator and, for the higher frequencies, is filled with the relatively strong noise components the error signal. The output signal of the sigma-delta modulator may thus be assumed to be formed by the input signal having virtually no additional noise and by an error signal having much noise, but whose noise spectrum is situated nearly entirely outside the spectrum of the input signal. The mean value of the output signal is proportional to the input signal. If there is a minimum input signal, the output signal will nearly always be +1, and if there is a maximum input signal, the output signal will nearly always be −1. If the input signal is halfway between minimum and maximum, the output signal will comprise on average as many times a +1 as a −1. For further orientation about noise shapers, reference be made to the technical literature and, more specifically, to:

(1) "Oversampled, Linear Predictive and Noise-Shaping Coders of Order N>1", IEEE Transactions on Circuits and Systems, Vol. CAS-25, No. 7, July 1978, pp. 436-447;

(2) "A 14-Bit 80-kHz Sigma-Delta A/D Converter: Modelling, Design, and Performance Evaluation", IEEE Journal of Solid State Circuits, Vol. 24, No. 2, April 1989, pp. 256-266;

(3) "Stereo 16-Bit Delta-Sigma A/D Converter for Digital Audio", Journal of the Audio Engineering Society, Vol. 37, No. 6, June 1989, pp. 476-486;

(4) "Chaos, Oversampling and Noise Shaping in Digital-to-Analog Conversion", Journal of the Audio Engineering Society, Vol 37, No. 12, December 1989, pp. 980-1001.

The invention is based on the understanding to use the output signal of a noise shaper as a decision signal for sample validation, the input to the noise shaper being supplied with a signal which is a measurement for the difference between the given and desired sampling frequencies. This achieves that the mean value of the number of repeated or omitted samples is exactly equal to the desired sampling frequency difference. The errors made during this validation process have a high-frequency spectrum which does not alias to the spectrum of the sampled analog signal if a sufficient bandwidth is provided by oversampling and interpolation of the digital signal to be converted. The high-frequency noise spectrum may then be eliminated by means of downsampling and decimation. It has appeared that when a third-order noise shaper is used, an oversampling factor from 64 to 96 will be sufficient to vary the sampling frequency of a Compact Disc quality digital audio signal (analog signal-to-noise ratio better than 90 dB) within said limits (32-48 kHz). This implies an oversampling frequency of about 5 MHz, which is thus 300 times as low as aforementioned 1.5 GHz frequency. The digital interpolation and decimation filters which are necessary as required can have relatively simple structures because their filter coefficients have fixed values.

It should be observed that the manner of interpolation and decimation, the type of sigma-delta modulator and the manner in which the sigma-delta modulator output signal affects the validation, all have influence on the signal quality of the eventual analog signal. Thus, there is ample freedom of choice and design of the components. This choice, however, finds its limitations in the given or desired analog signal quality.

A first embodiment of a sampling frequency converter according to the invention is characterized in that the sampling frequency converter further includes:

an interpolation filter having an input connected for receiving a discrete-time input signal with a fourth sampling frequency so as to increase the fourth sampling frequency by a first factor N to the first sampling frequency, and for supplying discrete-time samples at an output at the rate of the first clock pulses, where N is a number greater than or equal to 1;

a decimation filter having an input connected for receiving the discrete-time samples available at the output of the interpolation filter so as to reduce the sampling frequecy of these samples by a second factor M at the rate of the third clock pulses, where M is a number greater than or equal to 1, and for supplying discrete-time samples at an output at the rate of a fifth sampling frequency having a value equal to the value of the third clock pulse frequency divided by the factor M; and buffer means having an input for receiving discrete-time samples available at the output of the decimation filter at the rate of the fifth sampling frequency and having an output for supplying these samples at the rate of the second clock pulses in the order in which they are received at the input of the buffer means.

In this embodiment a digital input signal is first oversampled with an interpolation filter, then downsampled with a decimation filter and, finally, re-sampled according to a new time pattern. The validation gate intermittently interrupts the first clock pulses so that there is a brief stagnation at the decimation filter. At that moment no sample is accepted from the output of the interpolation filter. Such a sample is actually lost. The sample stream at the output of the decimation filter also stagnates and thus has an irregular rhythm. This rhythm is compared with the desired output clock rate in the frequency meter and converted to the control signal which is converted to the validation decision signal by the sigma-delta modulator. The irregular rate is restored in the buffer means. This embodiment is suitable for sampling frequency conversion if clock pulses of the digital signal to be converted are available at multiples of the sampling frequency.

The manner in which the validation gate reacts to the decision signal has its influence on the frequency conversion and the noise caused by the validation. The first embodiment according to the invention is thereto further characterized, in that the validation gate is arranged for sequentially blocking not more than a single pulse of the first clock pulses during the first value of the decision signal, or in that the validation gate is arranged for blocking each pulse of the first clock pulses during the first value of the decision signal. In the former case the noise level is low, because more than one sample will never be omitted consecutively. In the latter case the noise level is higher, because more than one sample may be omitted consecutively, but, on the other hand, the sampling frequency converter is capable of coping with a greater sampling frequency difference.

A second embodiment of a sampling frequency converter according to the invention is characterized, in that the sampling frequency converter comprises:

buffer means having an input connected to a discrete-time input signal which has the second sampling frequency, for receiving samples at the rate of the second clock pulses and having an output for supplying these samples at the rate of a sixth sampling frequency in the order in which they are received at the input of the buffer means, an interpolation filter having an input connected to the output of the buffer means, for enhancing the value of the sixth sampling frequency by a first factor N, where N is an integer greater than or equal to 1, to the third sampling frequency, and for suppling discrete-time samples at an output at the rate of the third clock pulses, and a decimation filter having an input for receiving discrete-time samples from the output of the interpolation filter so as to reduce the sampling frequency of these samples at the rate of the first clock pulses by a second factor M, and for supplying discrete-time samples at an output at the rate of a seventh sampling frequency having a value equal to the value of the third clock pulse frequency divided by the factor M.

In this embodiment a digital input signal is first stored in a buffer, then interpolated, after which it is decimated. The validation gate here interrupts the clock pulses for the interpolation filter. The resultant stagnation in the reception of the digital signal samples to be converted is eliminated in the buffer means which is now located at the input side of the sampling frequency converter. There is a continuous intake of samples by the decimation filter and this intake is continued while stagnation occurs at the interpolation filter. The sample then available at the output of the interpolation filter is thus actually repeated. This embodiment is especially suitable for applications in which the digital signal source produces only clock pulses or regenerated clock pulses whose rate corresponds to the signal source sampling frequency.

The manner in which the validation gate responds to the decision signal here again affects the frequency conversion and the noise caused by the validation. The second embodiment according to the invention is thereto further characterized, in that the validation gate is arranged not to block consecutively more than one pulse of the first clock pulses during the first value of the decision signal, or in that the validation gate is arranged to block each pulse of the first clock pulses during the first value of the decision signal. In the former case the noise level is low because there will never be an omission of more than one sample in a row. In the latter case the noise level is higher because more than one sample may be omitted in a row, but, on the other hand, the sampling frequency converter is capable of coping with a greater sampling frequency difference.

BRIEF DESCRIPTION OF THE DRAWINGS

The invention will now be further explained with reference to the appended drawing Figures, in which.

In these Figures, elements having like connotations or function have like reference numerals.

DESCRIPTION OF THE PREFERRED EMBODIMENT

Figure 1:
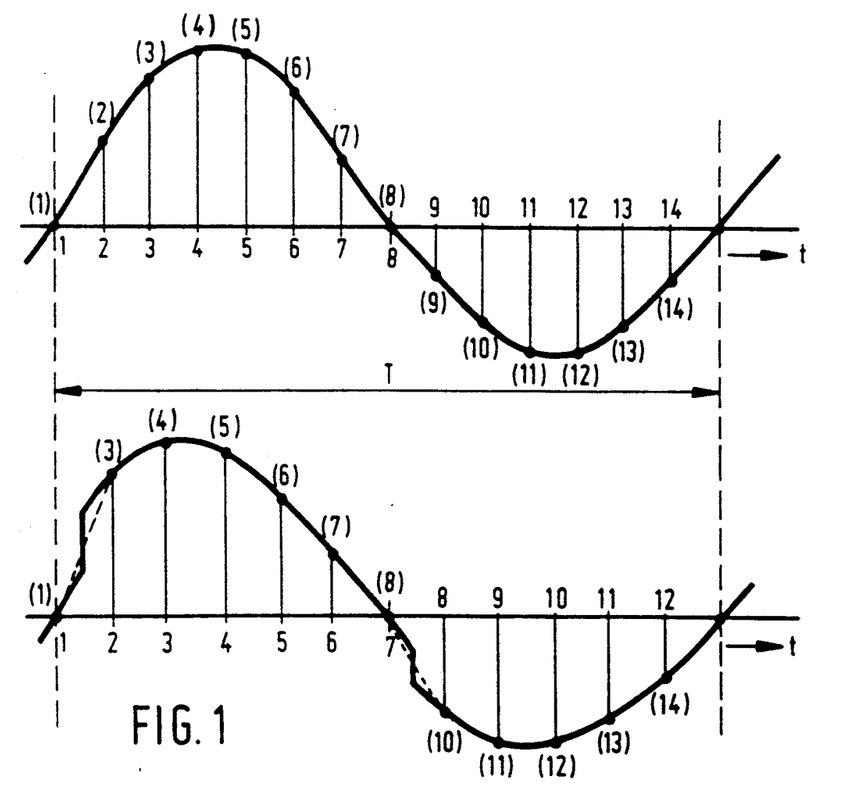
FIG. 1 shows diagrams of signal shapes in explanation of the invention.

One of the simplest means of changing the sampling frequency of a discrete-time signal works is according to the validation principle, that is to say, omission or repetition of a specific number of samples of the signal per unit of time, depending on the frequency difference between the given and desired sampling frequencies. FIG. 1 shows a sine-shaped analog signal having a period T, which is sampled 14 times per period. For sampling frequency reduction, always two samples are omitted, that is to say, the samples numbered 2 and 9, after which the remaining 12 samples are rearranged with equidistant spacing over the period T. The frequency of the original signal remains unimpaired, but the shape of the signal is considerably disturbed by this process. A modulation at a rate having a period T/2 of the analog signal is developed which modulation cannot be removed by means of filtering. The signal jumps caused by this modulation may be compared with the signal jumps in a sine-shaped signal whose phase is changed in steps, as happens with Phase Shift Keying. The omission of a sample from the sampled sine-shaped signal in FIG. 1 may be regarded as a phase shift of 360/14 degrees. The shift becomes stronger with increasing analog frequencies in the sampled signal, because the omission of 2 out of 14 samples then happens relatively more often during each period of the analog signal. By first oversampling the available signal sample sequence according to the given time pattern and then resampling same according to the desired time pattern for which always the nearest sample of the oversampled sequence is taken, the resultant analog signal distortion may be reduced to acceptable proportions. In afore-said ICASSP 81 article there is stated that an oversampling factor $2^{15} = 32768$ is necessary for an audio signal having a 20 Khz frequency which is sampled with a frequency of about 50 Khz so that a 90 Db signal-to-noise ratio is obtained after rearrangement. This necessitates an oversampling frequency of about 1.5 Ghz. The selection of the nearest sample is then made according to such a finely tuned time pattern that the resultant modulation of the resultant analog signal cause a distortion which remains below the set limit of 90 Db. Such a high frequency renders the implementation of this type of sampling frequency converters rather difficult.

Figure 2A:
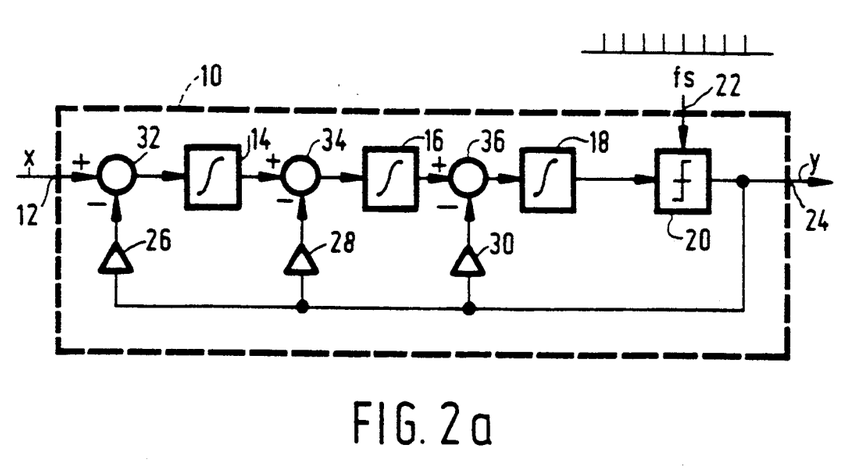
FIGS. 2a-c show the basic circuit diagram, output signal and clock signal and the spectrum of the error component in the output signal of a sigma-delta modulator.
Figure 2B:
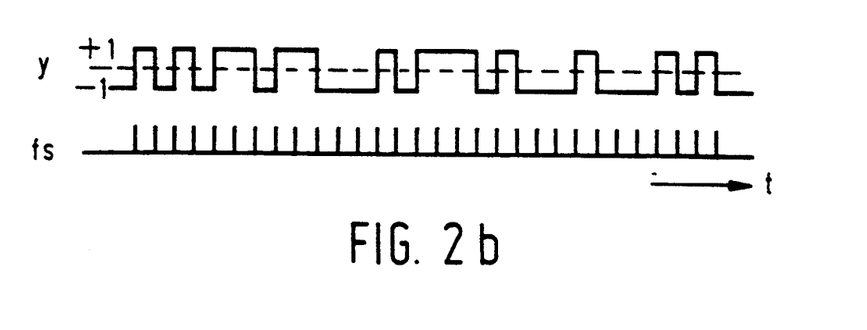

The underlying though of the invention is to have the validation process proceed under the control of the output signal of a sigma-delta modulator, whose input is supplied with a signal which is a measurement for the frequency difference between the given and desired sampling frequencies. Sample validation then proceeds according to a pattern which characterizes the output signal of a sigma-delta modulator and is much less disturbing than a fixed pattern of the type as shown in FIG. 1. Sigma-delta modulators are known per se in all sorts of variants and may have an analog or digital structure. FIG. 2a shows by way of example a frequently used third-order sigma-delta modulator 10. An input signal x at an input 12 passes through a series combination of three first-order integrating networks 14, 16 and 18. The filtered signal is quantized in a 1-bit quantizer 20 at the rate of a relatively high clock signal $f_s$ at clock input 22, and converted to a bit stream output signal y at output 24. Suitably selected multiplicators 26, 28 and 30 apply, by means of negative feedback, the output signal y to the inputs of the integrating networks 14, 16 and 18 which comprise summing stages 32, 34 and 36. FIG. 2b shows the output signal y and the clock signal $f_s$. The signal y constantly varies between the extreme values of $+1$ and $-1$ at the rate of the clock signal $f_s$. The output signal y is a signal having a relatively large quantizing error e(t), whose frequency spectrum E(f) shown in FIG. 2c, however, as a result of the negative feedback and the third-order filtering, has a reverse shape of the filter characteristic of the third-order filtering. Consequently, the mean value of the output signal y is equal to the instantaneous value of the input signal x. A decimation filter may be used for eliminating the quantization noise E(f).

Figure 2C:
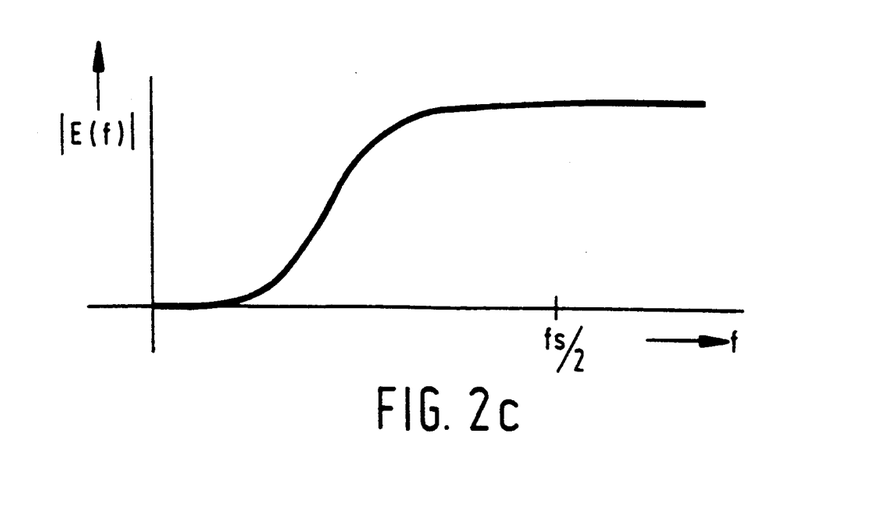

By taking for the input signal x a signal which is a measurement for the frequency difference between the given and desired sampling frequencies of a discrete-time signal, whose sampling frequency is to be changed according to the validation process, there is achieved that the distortion caused by the sample validation has a spectrum as shown in FIG. 2c. The mean value of the number of omitted or repeated samples is exactly equal to the desired sampling frequency difference, whereas the amplitude and phase modulation caused by this validation process comprises mainly high-frequency components which will not be aliased with sufficient oversampling. These high-frequency components may then be suppressed by means of decimation filters as desired. The result is a new sample stream at the desired sampling frequency which represents a distortionless analog signal.

Oversampling and selecting the nearest sample according to the new time pattern may be effected with a lower oversampling frequency owing to the fact that the sigma-delta modulator output signal is used as a validation criterion. The power density of the validation noise, for that matter, is removed to a less annoying frequency zone which may be filtered. It could also be observed that validation is now effected largely at random and is thus less annoying. The selection of the nearest sample from the oversampled series at the rate of the new time pattern and the attendant sample omission or sample repetition (validation) does not take place according to a strict pattern, but according to a fast and random pattern causing much less distortion. Therefore, it is possible to obtain the same signal-to-noise ratio with a lower oversampling frequency.

Figure 3:
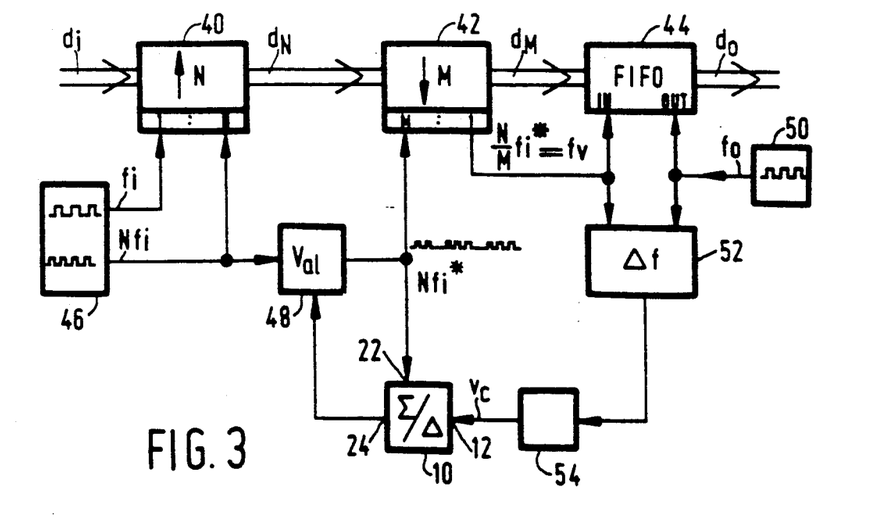
FIG. 3 shows the basic circuit diagram of an embodiment of a sampling frequency converter according to the invention.

FIG. 3 represents the block diagram of a first embodiment of a sampling frequency converter according to the invention. It comprises a cascaded combination of an interpolation filter 40, a decimation filter 42 and a First In First Out (FIFO) buffer 44. The discrete-time signal $d_i$ to be converted, whose samples occur at the rate of low first clock pluses $f_i$ coming from low first clock pulse means 46, is changed in the interpolation filter 40 into a discrete-time signal $d_N$ having an N times higher sampling frequency similar to the high first clock pulses having a frequency $Nf_i$ which are also supplied by the first clock pulse means 46. The sampling frequency of the discrete-time signal $d_N$ is then reduced in the decimation filter 42 by a factor M at the rate of a validated clock signal $Nf_i^*$ which has developed by validating the high first clock pulses $Nf_i$ have been validated in a validation gate 48. Both N and M are integers greater than or equal to 1. In this embodiment clock pulses are omitted from the series of equidistant clock pulses $Nf_i$. Thus, there are clock pulses lacking in the clock signal $Nf_i^*$. As a result, the discrete-time output signal $d_M$ of the decimation filter 42 occurs at a reduced rate $f_v = (N/M)f_i^*$, which rate presents stagnation. This stagnation with respect to the signal $d_M$ is again removed in the FIFO buffer 44. The samples of the signal $d_M$ are written at the stagnating clock rate $f_v$ and read out again at a clock rate $f_o$ of second clock signal means 50 in the order in which they have come in. In this manner a resampled discrete-time signal $d_o$ is developed whose samples occur at equidistant instants at the rate of the (desired) frequency $f_o$. The instantaneous frequency difference between the stagnating pulse sequence $f_v$ and the continuous pulse sequence $f_o$ is converted to a control signal $v_c$ in a frequency meter 52 and applied to the input 12 of a sigma-delta modulator 10, for example, of the type shown in FIG. 2a, through a loop filter 54 or not. The 1-bit quantizer of the sigma-delta modulator is clocked with the clock signal $Nf_i^*$ applied to the clock input 22. The 1-bit signal of output 24 is applied to the validation gate 48.

Validation is effected as follows:

if the output signal of the sigma-delta modulator is $+1$, a sample from the oversampled discrete-time signal $d_M$ is accepted and passed, if the output signal of the sigma-delta modulator is $-1$, a sample from the oversampled discrete-time signal $d_N$ is not accepted, and omitted, but the next sample is again passed.

In this manner, there will never be an omission of two consecutive samples. For this purpose, the clock pulse for the decimation filter is briefly stopped if a redundant sample in the signal $d_N$ is to be omitted. The frequency meter 52, the sigma-delta modulator 10, the validation gate 48 and the decimation filter 42 form a control loop maintaining the mean frequency of the stagnating clock signal $f_v$ equal to the continuous frequency $f_o$. Because the sigma-delta modulator is clocked with the stagnating clock pulses $Nf_i^*$, it is necessary for the validation gate 48 to comprise a restart circuit to restart the sigma-delta modulator 10 and the decimation filter 2 after a clock pulse has been omitted.

Figure 4:
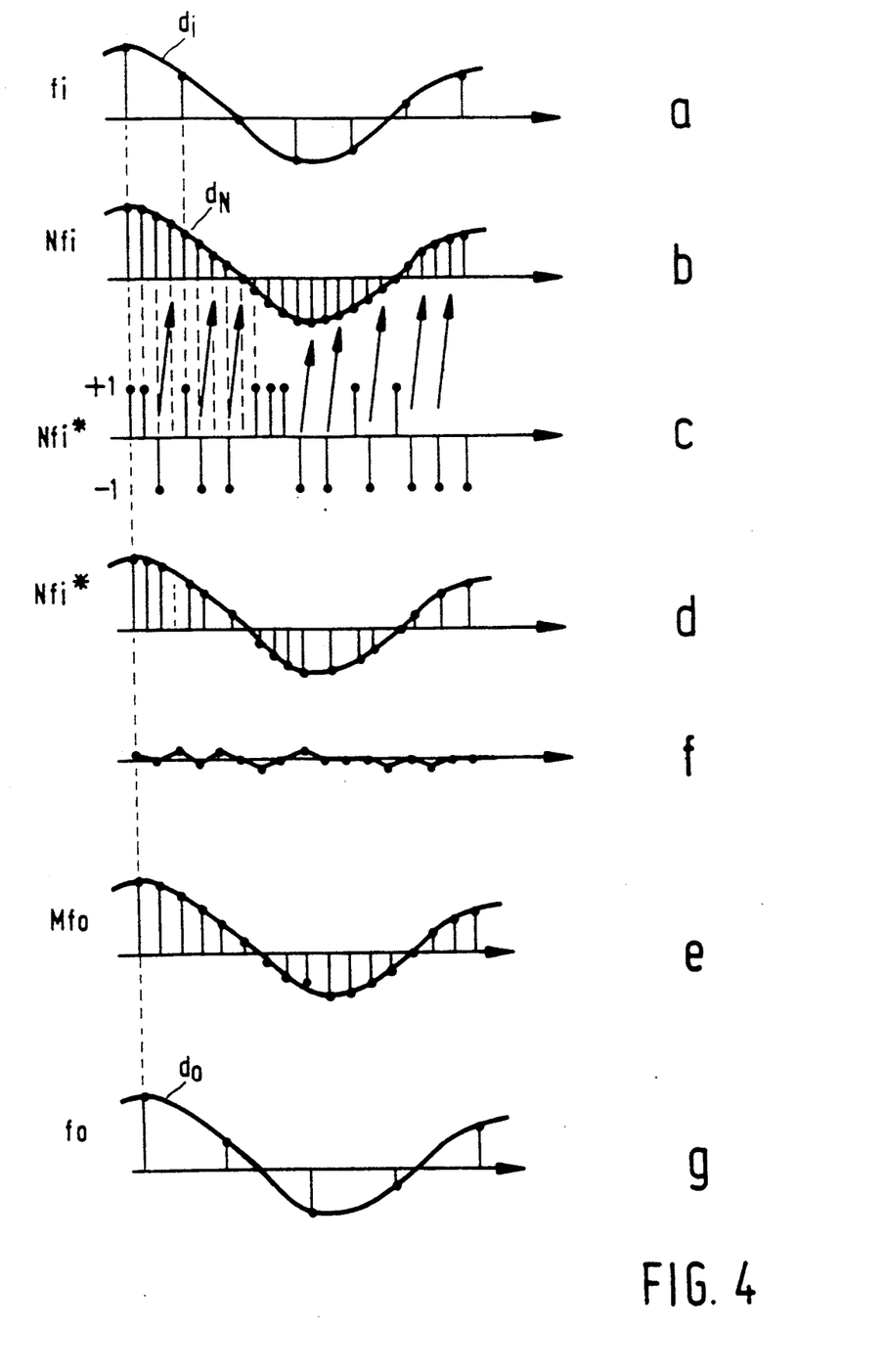
FIG. 4 shows signals occurring in the sampling frequency converter shown in FIG. 3.

FIG. 4 gives an impression of the signals occurring in the sampling frequency converter as shown in FIG. 3. FIG. 4a shows the discrete-time signal $d_i$ with the sampling frequency $f_i$. FIG. 4b shows the signal $d_N$ obtained by quadruple (N=4) oversampling and interpolation of the signal $d_i$. FIG. 4c shows the output signal of the sigma-delta modulator 10 occurring at the rate of the stagnating clock $Nf_i^*$. If the output signal is $-1$, the next sample is not accepted by the decimation filter 42. By way of example the situation is shown in which 8 out of 25 samples are omitted. FIG. 4d shows which samples the decimation filter processes at the rate of the stagnating clock $Nf_i^*$. The same sequence of samples, but now situated according to an equidistant time pattern $Mf_o$ is shown in FIG. 4e. The resultant error signal is shown in FIG. 4f. Finally, FIG. 4g shows the output signal $d_o$ after quadruple decimation (M=4) and rearrangement according to an equidistant time pattern having frequency $f_o$. The error signal is reduced due to the filtering by the decimation filter 42.

Figure 5:
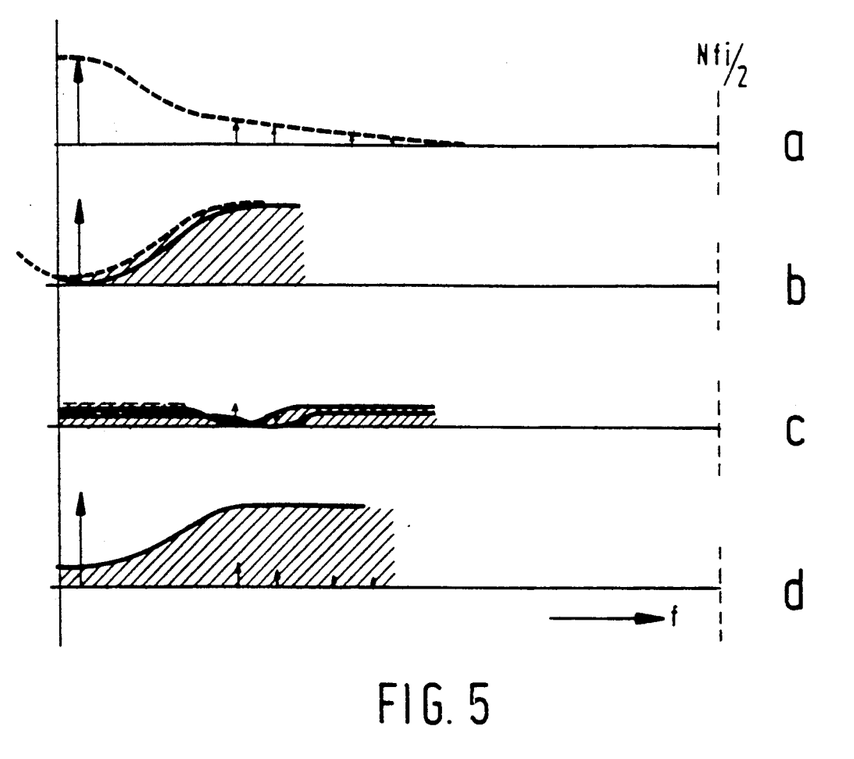
FIG. 5 shows frequency spectrums of signals occurring in the sampling frequency converter shown in FIG. 3.

FIG. 5 shows the frequency spectrums of several signals occurring in the sampling frequency converter shown in FIG. 3. FIG. 5a shows the spectrum of the oversampled and filtered sine-shaped signal $d_N$ at the output of the interpolation filter 40. FIG. 5b shows the spectrum of the fundamental wave after validation. Phase modulation causes side bands to occur on both sides of the fundamental wave, with one side band aliasing. The aliased side band is drawn in dashed lines. The harmonics of the fundamental wave also undergo a phase modulation, which is represented in FIG. 5c. This phase modulation is relatively deeper, but the overall contribution to the modulation spectrum is nevertheless small due to the relatively small amplitude of the harmonics with respect to the fundamental wave. FIG. 5d shows the overall spectrum of the validated signal $d_N$ as it will be processed by the decimation filter. The modulation spectrum is subsequently effectively suppressed in the decimation filter 42.

The frequency difference which may be processed with this sampling frequency converter is determined by the factors N and M and by the range in which the sigma-delta modulator 10 can be driven to full power. It is known that the input signal of sigma-delta modulators must not be driven to the theoretical minimum or maximum power so as to avoid instabilities in the sigma-delta modulator. A safe limit for a third-order sigma-delta modulator is situated around 78% of the theoretical maximum and minimum values. The conversion ratios to be achieved with this sampling frequency converter can be calculated with:

$$f_o = \left( \frac{2N}{(3 - v_c)M} \right) f_i$$

Figure 10A:
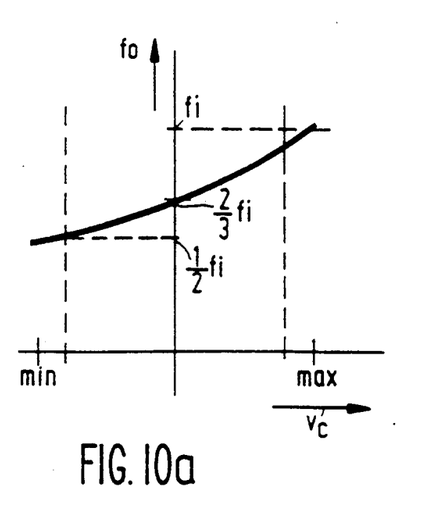
FIGS. 10a-10d show diagrams in explanation of the invention.

FIG. 10a shows the relation between the control signal $v_c$ and the frequencies $f_i$ and $f_o$ for M=N. With a maximum control signal $v_c$ the output signal of the sigma-delta modulator is always +1 and all samples are passed, so that $f_o = f_i$. With a minimum control signal the output signal is always -1 and half the number of samples are passed, so that $f_o = f_i/2$. If the control signal is zero, one third of the samples is omitted, so that $f_o = 2 f_i/3$. The 78% limits are indicated by means of dashed lines. Because the validation gate never consecutively omits more than one sample from the oversampled signal $d_N$, the disturbance is relatively small. This is offset by the fact that there is a relatively small range in which the frequency difference between $f_i$ and $f_o$ may be situated.

Figure 6:
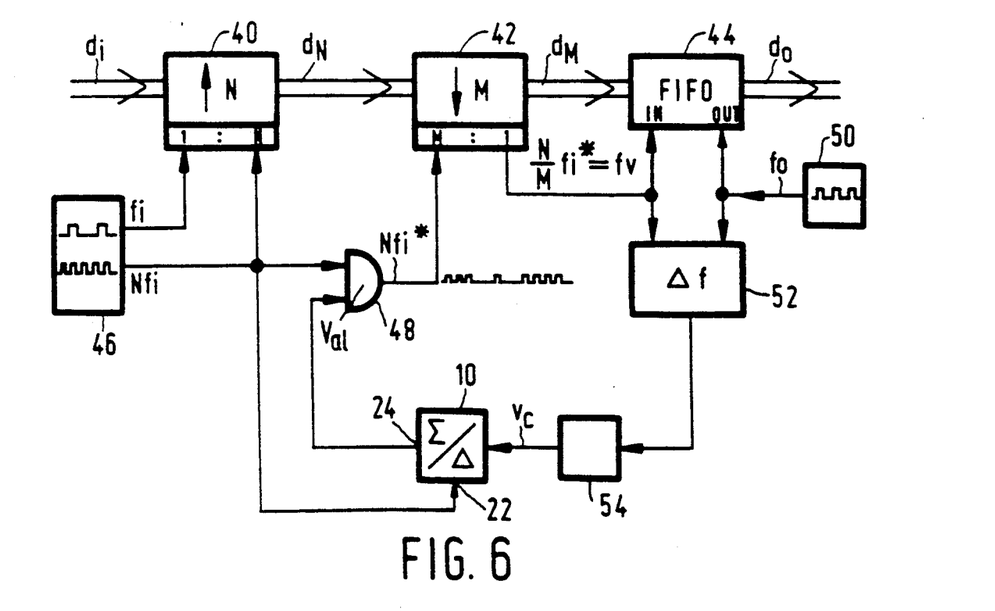
FIG. 6 shows the basic circuit diagram of an embodiment of a sampling frequency converter according to the invention.
Figure 7:
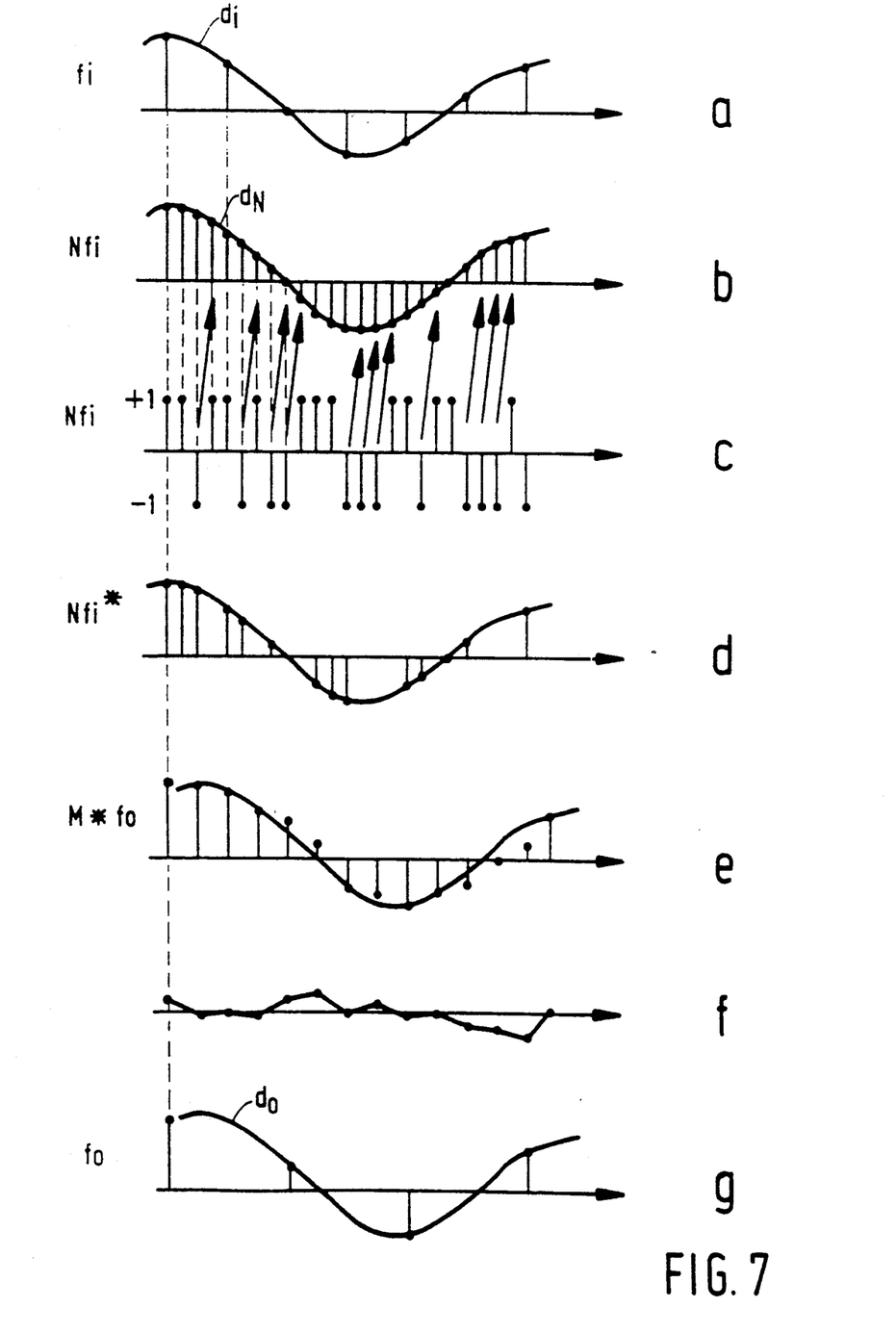
FIG. 7 shows signals occurring in the sampling frequency converter shown in FIG. 5.

FIG. 6 shows a variant of the sampling frequency converter shown in FIG. 3. Validation is performed here as follows:

if the output signal of the sigma-delta modulator is +1, a sample from the oversampled discrete-time signal $d_N$ is accepted and passed;

if the output signal of the sigma-delta modulator is -1, a sample of the oversampled discrete-time signal $d_N$ is not accepted and thus omitted. Consecutive samples are now omitted indeed if the output signal of the sigma-delta modulator remains negative. For this purpose, the clock pulse for the decimation filter is stopped if a redundant sample in the signal $d_N$ is to be omitted. The sigma-delta modulator is thereto clocked with the continuous clock pulses $Nf_i$. FIG. 7 shows the signals belonging to this variant in similar fashion and in similar order to FIG. 4 and is further self-explanatory. Also in this case the factors N and M are selected to be equal to four by way of example, whereas 11 out of the 25 samples are assumed to be omitted. The conversion ratios that may be obtained with this variant of the sampling frequency converter can be calculated with:

$$f_o = \left( \frac{(1 + v_c)N}{2M} \right) f_i$$

Figure 10B:
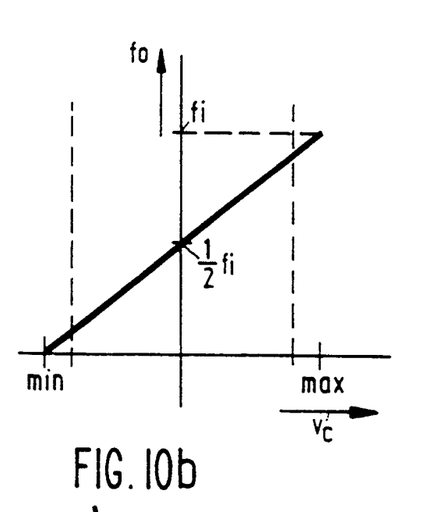

FIG. 10b shows the relation between the control signal $v_c$ and the frequencies $f_i$ and $f_o$ for M=N. With a maximum control signal $v_c$ the output signal of the sigma-delta modulator is always +1 and all samples are passed, so that $f_o = f_i$. With a minimum control signal the output signal is always -1 and all samples are omitted, so that $f_o = 0$. If the control signal is zero, half the number of samples are omitted, so that $f_o = f_i/2$. The 78% limits are indicated by means of dashed lines. This variant has a large range, but, on the other hand, the noise signal is larger.

Figure 8:
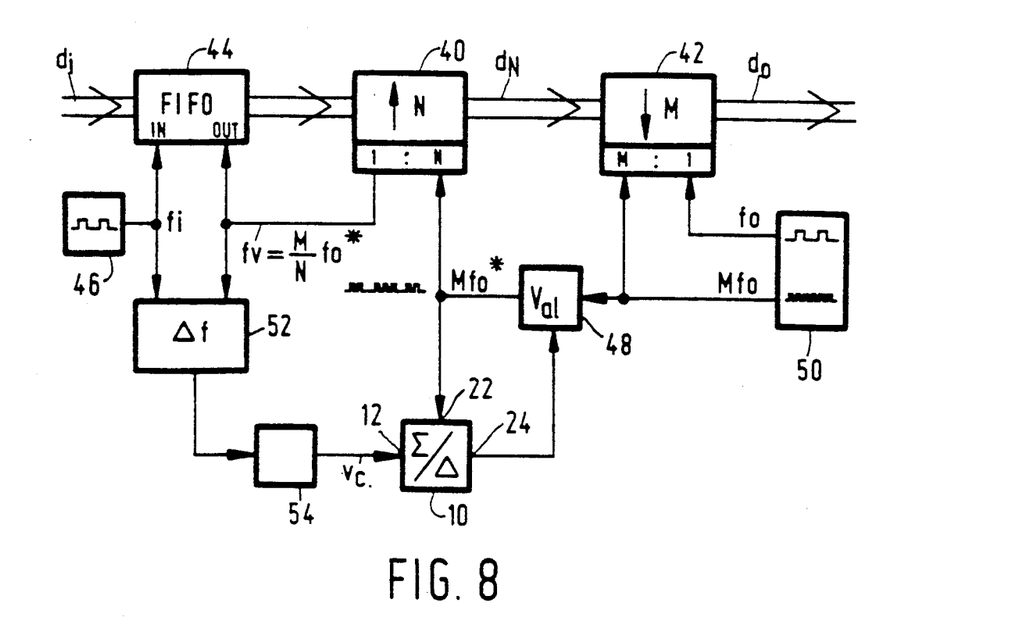
FIG. 8 shows the basic circuit diagram of an embodiment of a sampling frequency converter according to the invention.

The sampling frequency converters as shown in FIGS. 3 and 6 are suitable for applications in which the clock signals $f_i$ and $Nf_i$ associated to the discrete-time input signal $d_i$ are available. However, the situation may also be reversed. In that case, the clock signals of the output signal are available. For such applications a sampling frequency converter as shown in FIG. 8 presents a solution. This solution comprises the same elements as those shown in FIG. 3, but they are connected differently. The buffer 44 is now inserted before the interpolation filter 40 instead of after the decimation filter 42. The first clock means 46 produce clock pulses at the rate of the sampling frequency $f_i$ of the discrete-time input signal $d_i$. The FIFO buffer 44 reads the samples of the signal $d_i$ at the rate of the clock $f_i$ and provides the samples in the order in which they arrived at the rate of a stagnating clock signal $f_v$, the latter originating from the interpolation filter 40. The difference between the frequencies $f_i$ and $f_v$ is converted to a control signal $v_c$ in the frequency meter 52. The sigma-delta modulator 10 converts this control signal again to a binary output signal which controls the validation gate 48. The second clock means apply low second clock pulses $f_o$ and high second clock pulses $Mf_o$ to the decimation filter 42. The high second clock pulses $Mf_o^*$ validated by the validation gate are applied to the clock input 22 of the sigma-delta modulator 10 and to a clock input of an interpolation filter 40. The stagnating frequency $f_v$ is equal to $f_v = (M/N)f_o^*$.

Validation is effected as follows:

if the output signal of the sigma-delta modulator is +1, a sample from the oversampled discrete-time signal $d_N$ is accepted and passed;

if the output signal of the sigma-delta modulator is -1, a sample from the oversampled discrete-time signal $d_N$ is accepted and repeated only once. A sample will thus never be repeated more than once. Thereto the clock pulse for the interpolation filter is briefly stopped if a sample from the signal $d_N$ is to be repeated. Also in this arrangement a restart circuit is to be included in the validation gate 48 to restart the sigma-delta modulator 10 and the interpolator 40 after a sample has been repeated. The conversion ratios that may be obtained with this variant of the sampling frequency converter shown in FIG. 8 may be calculated with:

$$f_0 = \left( \frac{(3 - v_c)N}{2M} \right) f_i$$

Figure 10C:
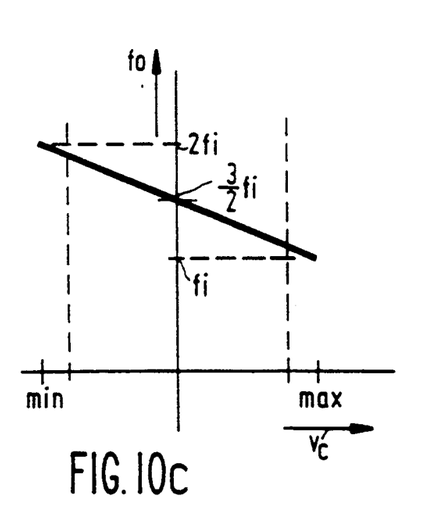

FIG. 10c shows the relation between the control signal $v_c$ and the frequencies $f_i$ and $f_o$ for M=N. With a maximum control signal $v_c$ the output signal of the sigma-delta modulator is always +1 and all samples are passed, so that $f_o = f_i$. With a minimum control signal the output signal is always −1 and all samples are repeated once, so that $f_o = 2f_i$. If the control signal is zero, half the number of samples are repeated, so that $f_o = 3f_i/2$. The 78% limits are indicated by means of dashed lines. As with the sampling frequency converter shown in FIG. 3, this sampling frequency converter shown in FIG. 8 has a low noise level and a relatively small range for any frequency difference between $f_i$ and $f_o$.

Figure 9:
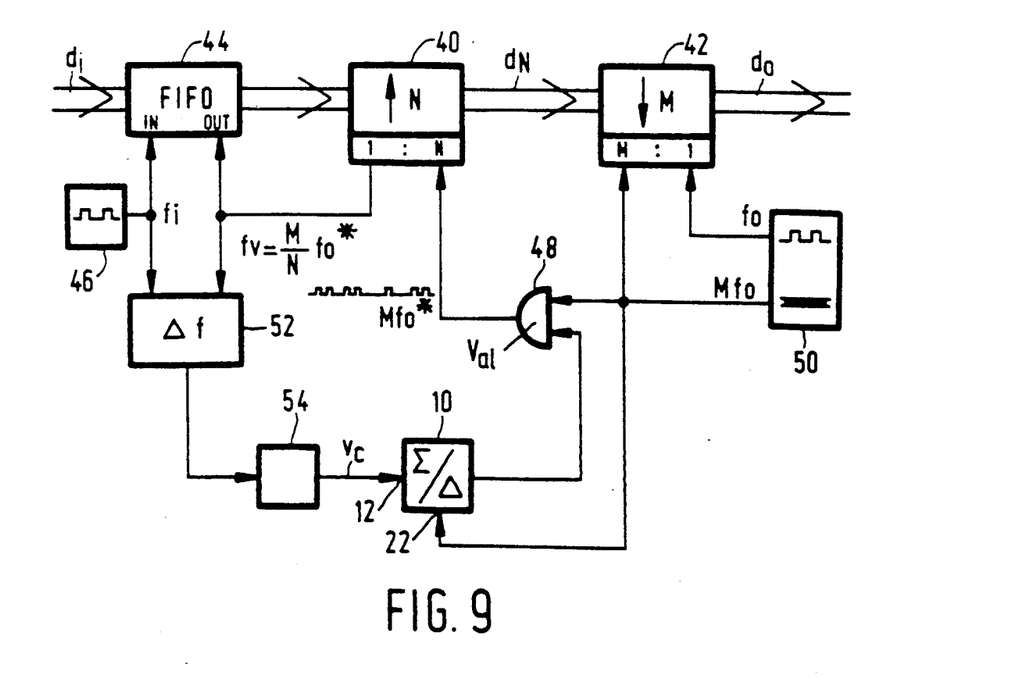
FIG. 9 shows the basic circuit diagram of an embodiment of a sampling frequency converter according to the invention.

FIG. 9 shows a variant of the sampling frequency converter shown in FIG. 8. Validation is now effected as follows:

if the output signal of the sigma-delta modulator is +1, a sample from the oversampled discrete-time signal $d_N$ is accepted and passed;

if the output signal of the sigma-delta modulator is −1, a sample from the oversampled discrete-time signal $d_N$ is accepted and repeated. When a negative signal continues to occur, a sample is intermittently repeated. For this purpose, the clock pulse for the interpolation filter is briefly stopped if a sample from the signal $d_N$ is to be repeated. The sigma-delta modulator is clocked with the continuous clock pulses $Mf_o$. The conversion ratios that can be obtained with this variant of the sampling frequency converter can be calculated with:

$$f_0 = \left( \frac{2N}{(1 + v_c)M} \right) f_i$$

Figure 10D:
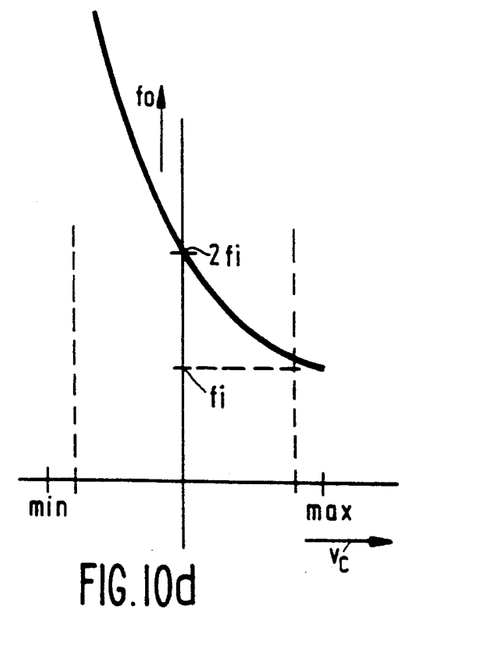

FIG. 10d shows the relation between the control signal $v_c$ and the frequencies $f_i$ and $f_o$ for M=N. With a maximum control signal $v_c$ the output signal of the sigma-delta modulator is always +1 and all samples are passed, so that $f_o = f_i$. With a minimum control signal the output signal is always −1 and all samples are repeated, so that $f_o$ is equal to infinity. If the control signal is zero, all samples are repeated one time on average so that $f_o = 2f_i$. The 78% limits are again indicated by dashed lines. The sampling frequency converter has a large range, but, on the other hand, the noise signal is larger.

The control signal $v_c$ applied to the input 12 of the sigma-delta modulator 10 is to comprise information about the frequency difference between the stagnating clock $f_v$ and the continuos clock $f_i$ or $f_o$. A pointer signal denoting how many samples are dwelling in the FIFO buffer may be used for this purpose. The frequency meter 52 is not necessary in that case. Should this pointer make too coarse steps for specific applications, the frequency meter 52 may be arranged as a resettable counter which counts the frequency difference in units of the high clock frequency $Nf_i$ or $Mf_o$. The control loop may comprise a loop filter which is adapted to the needs and specifications of the application. By rendering the loop filter 54 adaptive, a fast capturing time may be linked with high accuracy.

Which of the sampling frequency converters shown is to be selected is determined by a weighting of the available clock signals, the range of the sampling frequency differences that is to be achieved with a specific signal-to-noise ratio and the ease with which all this can be realized with respect to hardware. For example, interpolation and decimation filters may be combined so as to produce non-integer factors N and/or M for bringing the sampling frequency conversion within the range described by above formulas. Compact Disc quality can be obtained with a 64-time interpolation filter having a linear phase characteristic and having increasingly suppressed high frequencies, a 96-time decimation filter having a linear phase characteristic and also having increasingly suppressed high frequencies, a "breathing" buffer having a length attuned to the frequency variations that may be expected in the whole system, a third-order digital sigma-delta modulator and a digital loop filter having a proportional-integral characteristic.

Validation based on a more than binary sigma-delta modulator output signal is also possible. For example, not only the values of +1 and −1 may be useful for controlling a validation decision, but also the intermediate value 0 may be used for this purpose. In this fashion the range of sampling frequency differences may be increased or the noise level reduced.

Furthermore, it is possible to reduce the necessary oversampling factor N by selecting an interpolation algorithm attuned to the application. The output signal of the sigma-delta modulator may be used for influencing the coefficients of the interpolation filter. After oversampling with a factor $N_1$, the proportion for calculating the linear combination of two samples is controlled by the sigma-delta modulator output signal between 0:1 and 1:0 during the oversampling with remaining factor $N_2$. This can save hardware.

The sampling frequency converter of the type shown in FIG. 8 may be followed, as required, by a sampling frequency converter of the type shown in FIG. 3. The tandem thus formed could be simplified. The decimation filter 42 of FIG. 8 and the interpolation filter of FIG. 3 may be omitted. The clock pulse means 50 of FIG. 8 and the clock pulse means 46 of FIG. 3 may then be replaced by a common clock pulse generator which produces a common clock pulse with a frequency acting as $Mf_o$ (FIG. 8) and $Nf_i$ (FIG. 3) for the two validation gates 48. The two sigma-delta modulators 10 may be replaced by a single sigma-delta modulator. The decision signal of this single sigma-delta modulator now controls two validation gates. One gate suppresses common clock pulses if the decision signal is +1, the other gate if the decision signal is −1. If the decision signal is 0 no common clock pulses are suppressed. The sigma-delta modulator now produces a trinary decision signal in response to a control signal generated by a combined measurement of frequency differences.

I claim:

1. Sampling frequency converter for converting the sampling frequency of a discrete-time signal from a first frequency to a second frequency, comprising:
a first clock pulse generator for generating first clock pulses which occur with the first frequency,
a second clock pulse generator for generating second clock pulses which occur with the second frequency, selecting means for supplying selected samples of the discrete-time signal at the rhythm of third clock pulses which occur with a third frequency, a selection signal generator for generating the third clock pulses, characterized in that the selection signal generator comprises:

a frequency meter for generating a control signal in response to a frequency difference between the second frequency and a frequency which is proportional to the third frequency, a sigma-delta modulator for converting the control signal into an at least binary decision signal, a validation gate for generating the third clock pulses in response to the first clock pulses by suppressing and passing the first clock pulses during first and second decision signal values respectively.

2. Sampling frequency converter as claimed in claim 1, characterized in that the sampling frequency converter further includes:

an interpolation filter having an input connected for receiving a discrete-time input signal with a fourth sampling frequency so as to increase the fourth sampling frequency by a first factor N to the first sampling frequency, and for suppling discrete-time samples at an output at the rate of the first clock pulses, where N is a number greater than or equal to 1, a decimation filter having an input connected for receiving the discrete-time samples available at the output of the interpolation filter so as to reduce the sampling frequency of these samples by a second factor M at the rate of the third clock pulses, where M is a number greater than or equal to 1, and for supplying discrete-time samples at an output at the rate of a fifth sampling frequency having a value equal to the value of the third clock pulse frequency divided by the factor M;

buffer means having an input for receiving discrete-time samples available at the output of the decimation filter at the rate of the fifth sampling frequency and having an output for supplying these samples at the rate of the second clock pulses in the order in which they are received at the input of the buffer means.

3. Sampling frequency converter as claimed in claim 1, characterized in that the sampling frequency converter comprises:

buffer means having an input connected to a discrete-time input signal which has the second sampling frequency, for receiving samples at the rate of the second clock pulses and having an output for supplying these samples at the rate of a sixth sampling frequency in the order in which they are received at the input of the buffer means, an interpolation filter having an input connected to the output of the buffer means, for enhancing the value of the sixth sampling frequency by a first factor N, where N is an integer greater than or equal to 1, to the third sampling frequency, and for supplying discrete-time samples at an output at the rate of the third clock pulses, a decimation filter having an input for receiving discrete-time samples from the output of the interpolation filter so as to reduce the sampling frequency of these samples at the rate of the first clock pulses by a second factor M, and for supplying discrete-time samples at an output at the rate of a seventh sampling frequency having a value equal to the value of the third clock pulse frequency divided by the factor M.

4. Sampling frequency converter as claimed in claim 2, characterized in that the validation gate is arranged not to block consecutively more than one pulse of the first clock pulses during the first value of the decision signal.

5. Sampling frequency converter as claimed in claim 2, characterized in that the validation gate is arranged to block each pulse of the first clock pulses during the first value of the decision signal.

6. Sampling frequency converter as claimed in claim 2, characterized in that the sigma-delta modulator is arranged for supplying a more than binary decision signal.

7. Sampling frequency converter as claimed in claim 2, characterized in that the interpolation filter is arranged for adapting weight factors under the control of the decision signal.

8. Sampling frequency converter as claimed in claim 2, characterized in that the control signal is derived from a signal which is a measurement for the degree of filling of the buffer.

* * * * *